US00RE45071E

(19) United States
(12) Reissued Patent
Hong et al.

(10) Patent Number: US RE45,071 E
(45) Date of Reissued Patent: Aug. 12, 2014

(54) SEMICONDUCTOR LASER DIODE AND METHOD OF MANUFACTURING THE SAME

(75) Inventors: Sung Ui Hong, Seongnam-si (KR); Jin Hong Lee, Gwangju-si (KR); Jin Soo Kim, Jeonju-si (KR); Ho Sang Kwack, Paju-si (KR); Dae Kon Oh, Daejeon-si (KR)

(73) Assignee: Electronics and Telecommunications Research Institute, Daejeon (KR)

(21) Appl. No.: 13/070,906

(22) Filed: Mar. 24, 2011

Related U.S. Patent Documents

Reissue of:
(64) Patent No.: 7,508,857
Issued: Mar. 24, 2009
Appl. No.: 11/265,712
Filed: Nov. 2, 2005

(30) Foreign Application Priority Data

Dec. 14, 2004 (KR) ..... 10-2004-0105818
May 24, 2005 (KR) ..... 10-2005-0043466

(51) Int. Cl.
*H01S 5/22* (2006.01)

(52) U.S. Cl.
USPC ..... 372/46.01; 372/43.01; 372/45.01; 372/46.013

(58) Field of Classification Search
USPC ..... 372/46.01
See application file for complete search history.

(56) References Cited

U.S. PATENT DOCUMENTS 4,607,369 A * 8/1986 Niina et al. ..... 372/46.01
5,521,935 A * 5/1996 Irikawa ..... 372/45.011
5,615,224 A * 3/1997 Cohen ..... 372/36
6,044,098 A * 3/2000 Sun ..... 372/46.013
6,873,638 B2 3/2005 Haase et al.
2002/0034204 A1* 3/2002 Iwamoto et al. ..... 372/46
2002/0114367 A1* 8/2002 Stintz et al. ..... 372/45
2003/0007535 A1* 1/2003 Haase et al. ..... 372/50
2003/0165169 A1* 9/2003 Nomoto et al. ..... 372/46

FOREIGN PATENT DOCUMENTS

KR 10-0159015 8/1998
KR 0159015 8/1998
KR 10-034331 6/2002
KR 10-0343311 6/2002

* cited by examiner

*Primary Examiner* — Xinning Niu
(74) *Attorney, Agent, or Firm* — NSIP Law

(57) ABSTRACT

Provided are a semiconductor laser diode and a method of manufacturing the same. The semiconductor laser diode includes a lower cladding layer disposed on a substrate; a ridge including an optical waveguide layer, an active layer, an upper cladding layer, and an ohmic contact layer, which are sequentially stacked on the lower cladding layer, and having a predetermined width, which is obtained by performing a channel etching process on both sides of the ridge; an oxide layer disposed on surfaces of the upper and lower cladding layer to control the width of the ridge; a dielectric layer disposed on left and right channels of the ridge; an upper electrode layer disposed on the entire surface of the resultant structure to enclose the ridge and the dielectric layer; and a lower electrode layer disposed on a bottom surface of the substrate. The method is simpler than a conventional process of manufacturing a semiconductor laser diode. Also, by controlling a wet oxidation time, the width of a ridge can be freely controlled and an ohmic contact layer can be automatically formed.

36 Claims, 2 Drawing Sheets

SEMICONDUCTOR LASER DIODE AND METHOD OF MANUFACTURING THE SAME

Matter enclosed in heavy brackets [ ] appears in the original patent but forms no part of this reissue specification; matter printed in italics indicates the additions made by reissue.

CROSS-REFERENCE TO RELATED [APPLICATION] *PATENT APPLICATIONS*

This application [claims priority to and] *is for a reissue of U.S. Pat. No. 7,508,857, issued on Mar. 24, 2009, from application Ser. No. 11/265,712, filed on Nov. 2, 2005, which claims* the benefit of Korean Patent Application No. 2004-105818, filed Dec. 14, 2004, and *claims the benefit of* Korean Patent Application No. 2005-43466, filed May 24, 2005, the [disclosure] *entire disclosures* of which [is] *are* incorporated herein by reference [in its entirety] *for all purposes*.

BACKGROUND

1. Field of the Invention

The present invention relates to a deep ridge waveguide (RWG) laser diode, which employs quantum dots as an active layer and is used for optical communication, and a method of manufacturing the same, and more specifically, to a semiconductor laser diode and a method of manufacturing the same, which can freely control the width of a ridge and automatically form an ohmic contact surface by wet oxidation on portions of upper and lower cladding layers, so that the semiconductor laser diode can be manufactured in an easier manner than the conventional method and improved in characteristics.

2. Discussion of Related Art

In general, a conventional RWG laser diode, which uses an active layer as a quantum well (QW) layer, includes a ridge on which an ohmic contact surface is formed. In this case, since the ohmic contact surface should be smaller in width than the ridge, the RWG laser diode can be degraded in characteristics.

In order to overcome such drawbacks, it is necessary to develop a new technique of minimizing the width of the ridge while maximizing the width of the ohmic contact surface when an RWG laser diode is manufactured.

SUMMARY OF THE INVENTION

The present invention is directed to a semiconductor laser diode and a method of manufacturing the same, which can freely control the width of a ridge and automatically form an ohmic contact surface by performing a wet oxidation process on portions of upper and lower cladding layers, so that the semiconductor laser diode can be manufactured in an easier manner than the conventional method and improved in characteristics.

One aspect of the present invention is to provide a semiconductor laser diode including: a lower cladding layer disposed on a substrate; a ridge including an optical waveguide layer, an active layer, an upper cladding layer, and an ohmic contact layer, which are sequentially stacked on the lower cladding layer, and having a predetermined width, which is obtained by performing a channel etching process on both sides of the ridge;

an oxide layer disposed on surfaces of the upper and lower cladding layer to control the width of the ridge; a dielectric layer disposed on left and right channels of the ridge; an upper electrode layer disposed on the entire surface of the resultant structure to enclose the ridge and the dielectric layer; and a lower electrode layer disposed on a bottom surface of the substrate.

Another aspect of the present invention is to provide a method of manufacturing a semiconductor laser diode including the steps of: sequentially forming a lower cladding layer, an optical waveguide layer, an active layer, an upper cladding layer, and an ohmic contact layer on a substrate; forming a ridge having a predetermined width by sequentially removing the ohmic contact layer, the upper cladding layer, the active layer, and the optical waveguide layer using a predetermined photoresist layer as an etch mask until a portion of the lower cladding layer is exposed; forming an oxide layer on exposed surfaces of the upper and lower cladding layers; forming a dielectric layer on the entire surface of the resultant structure to enclose the ridge; removing the dielectric layer to expose the ohmic contact layer; forming an upper electrode layer on the entire surface of the resultant structure to enclose the ridge and the remaining dielectric layer; and forming a lower electrode layer on a bottom surface of the substrate.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 1A:
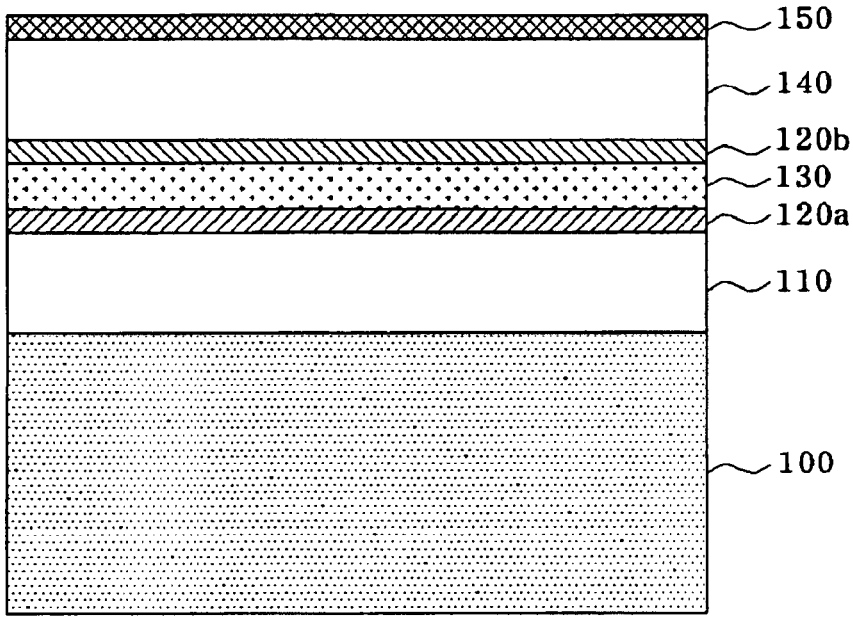
FIGS. 1A through 1D are cross-sectional views illustrating a method of manufacturing a semiconductor laser diode according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. The same reference numerals are used to denote the same elements.

FIGS. 1A through 1D are cross-sectional views illustrating a method of manufacturing a semiconductor laser diode according to an exemplary embodiment of the present invention.

Referring to FIG. 1A, a lower cladding layer 110, a first optical waveguide layer 120a, an active layer 130, a second optical waveguide layer 120b, an upper cladding layer 140, and an ohmic contact layer 150 are sequentially formed on, for example, an InP (001) substrate 100.

In this case, the lower cladding layer 110 is an n-type $In_{0.52}Al_{0.48}As$ layer, which is lattice-matched to the InP substrate 100, and may be formed to a thickness of about 1 to 2 μm, preferably, about 1.5 μm.

Each of the first and second optical waveguide layers 120a and 120b is an undoped $In_{0.52}Al_{0.25}Ga_{0.23}As$ layer having a separate confinement heterostructure (SCH) structure, which is lattice-matched to the InP substrate 100, and may be formed to a thickness of about 130 to 170 nm, preferably, about 150 nm.

The active layer 130 may be formed by repetitively forming InAs quantum dots and an undoped $In_{0.52}Al_{0.25}Ga_{0.23}As$ barrier layer in 3 to 7 cycles. The InAs quantum dots are spontaneously formed from InAs that is (about 3.2%) lattice-mismatched to the InP substrate 100, and the undoped $In_{0.52}Al_{0.25}Ga_{0.23}As$ barrier layer is lattice-matched to the InP substrate 100. Here, the thickness of the barrier layer may range from about 15 to 30 nm.

The upper cladding layer 140 is a p-type $In_{0.52}Al_{0.48}As$ layer, which is lattice-matched to the InP substrate 100, and may be formed to a thickness of about 1 to 2 μm, preferably, about 1.5 μm.

The ohmic contact layer 150 is a p-type $In_{0.53}Ga_{0.47}As$ layer, which is lattice-matched to the InP substrate 100, and may be formed to a thickness of about 130 to 170 nm, preferably, about 150 nm.

Meanwhile, the lower cladding layer 110, the first and second optical waveguide layers 120a and 120b, the active layer 130, the upper cladding layer 140, and the ohmic contact layer 150 may be formed using, for example, a molecular beam epitaxy (MBE) apparatus or a metal organic chemical vapor deposition (MOCVD) apparatus.

Figure 1B:
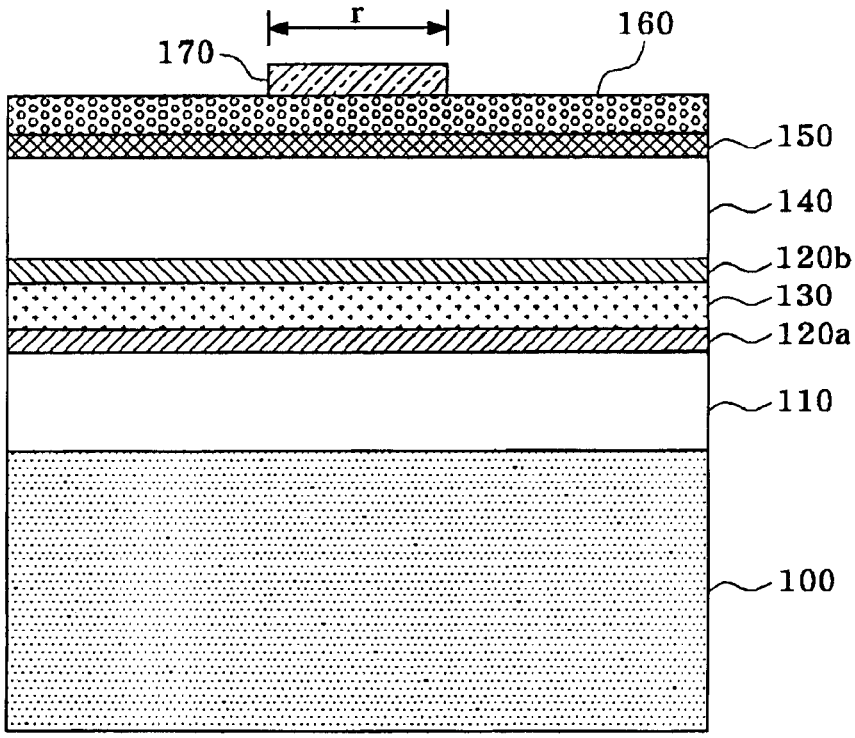

Referring to FIG. 1B, a first $SiN_x$ dielectric layer 160 is deposited on the ohmic contact layer 150 to a thickness of about 180 to 220 nm, preferably, about 200 nm, and a predetermined photoresist layer is coated thereon.

Next, a photoresist stripe 170 is formed using, for example, a photolithography process such that a ridge having a predetermined width "r" is formed.

Figure 1C:
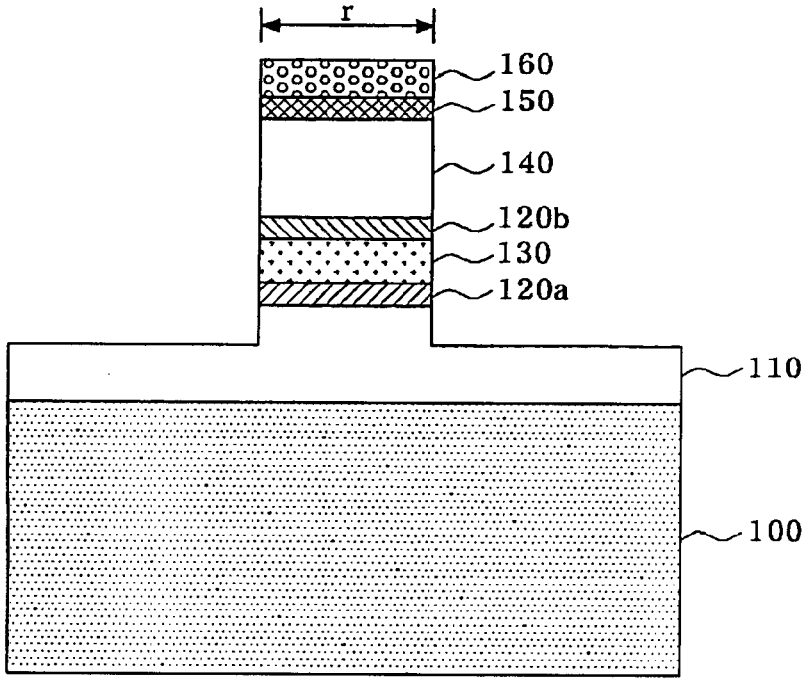

Referring to FIG. 1C, by using the photoresist stripe 170 as an etch mask, the first dielectric layer 160 is etched to the same width as the photoresist stripe 170 using, for example, a dry or wet etching process. Then, the photoresist stripe 170 is removed.

Thereafter, by using the remaining first dielectric layer 160 as an etch mask, the ohmic contact layer 150, the upper cladding layer 140, the second optical waveguide layer 120b, the active layer 130, and the first optical waveguide layer 120a are sequentially removed using, for example, a dry or wet etching process, such that the lower cladding layer 110 is exposed.

In order to form a deep ridge structure, the lower cladding layer 110 may be etched to a predetermined thickness.

Here, the ridge structure refers to a central protruding portion that is comprised of a portion of the lower cladding layer 110 and the remaining first waveguide layer 120a, active layer 130, second optical waveguide layer 120b, upper cladding layer 140, and ohmic contact layer 150.

Figure 1D:
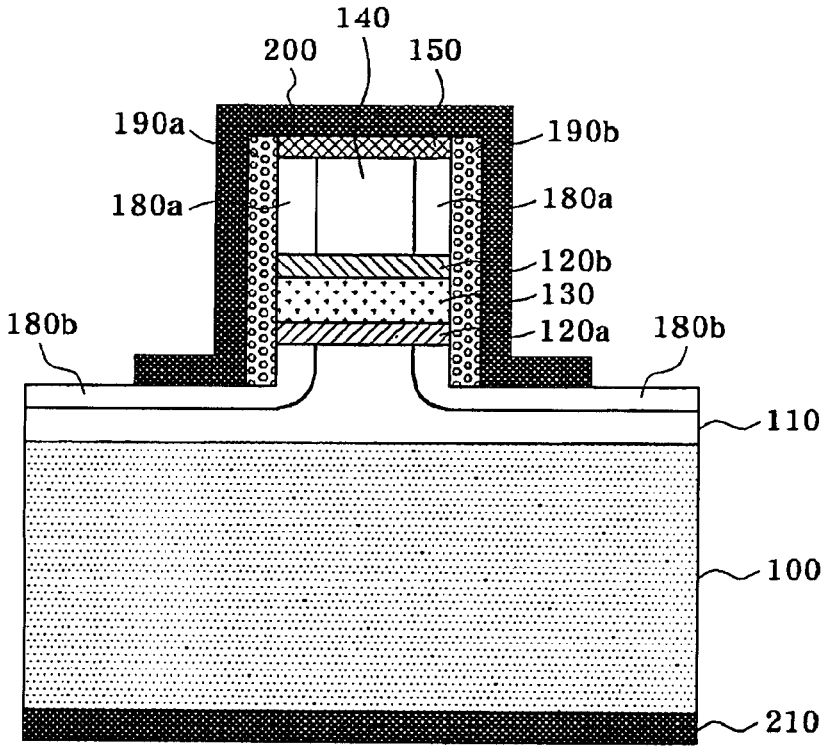

Referring to FIG. 1D, a wet oxidation process is carried out, for example, in an $H_2O$ atmosphere for about 1 to 7 hours at a temperature of about 480 to 520° C., preferably, about 500° C. Thus, Al oxide layers 180a and 180b are formed on surfaces of the exposed upper and lower cladding layers 140 and 110, respectively.

In this case, an $In_{0.52}Al_{0.48}As$ layer has an oxidation rate of about 162.5 nm/hr in a direction parallel to the InP substrate 100 and an oxidation rate of about 185.5 nm/hr in a direction vertical to the InP substrate 100, and the oxidation rate of an $In_{0.52}Al_{0.25}Ga_{0.23}As$ layer is about 1/100 the oxidation rate of the $In_{0.52}Al_{0.48}As$ layer. Owing to a difference in Al content, the $In_{0.52}Al_{0.48}As$ layer is different in oxidation rate from the $In_{0.52}Al_{0.25}Ga_{0.23}As$ layer.

Accordingly, by controlling the wet oxidation time, when the active layer 130 is much less oxidized than the upper and lower cladding layers 140 and 110, it is possible to freely control the width "r" of the ridge.

After the oxidation process, second $SiN_x$ dielectric layers 190a and 190b are deposited to enclose the ridge to a thickness of about 180 to 220 nm, preferably, about 200 nm, and then removed using, for example, a dry etching process until the ohmic contact layer 150 is exposed. Thus, an ohmic contact surface is automatically formed.

In this case, the dry etching process may be, for example, a magnetically enhanced reactive ion etching (MERIE) process.

Thereafter, an upper electrode layer 220 is formed of a p-type metal on the entire surface of the resultant structure to enclose the ridge and the second dielectric layers 190a and 190b. A bottom portion of the InP substrate 100 is lapped, and a lower electrode layer 210 is formed of an n-type metal on a bottom surface of the InP substrate 100. Thus, a deep RWG semiconductor laser diode according to the exemplary embodiment of the present invention is completed.

As described above, according to exemplary embodiments of the present invention, a wet oxidation process is performed on portions of upper and lower cladding layer of a deep ridge structure, so that the width of a ridge can be freely controlled and an ohmic contact surface can be automatically formed. As a result, the width of the ridge can be sufficiently reduced, thus lowering the threshold current density and contact resistance of a semiconductor laser diode. Therefore, the semiconductor laser diode of the present invention can be improved in characteristics and manufactured in an easier manner than the conventional method.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor laser diode comprising:

a lower cladding layer comprising InAlAs disposed on a substrate;

a ridge including an optical waveguide layer, a quantum dot active layer, an upper cladding layer comprising InAlAs, and an ohmic contact layer, which are sequentially stacked on the lower cladding layer, and having a predetermined width, which is obtained by performing a channel etching process on both sides of the ridge, wherein the ridge also includes a portion of the lower cladding layer;

an oxide layer formed by oxidizing surfaces of the upper and lower cladding layer to control an effective width of the ridge;

a dielectric layer disposed on left and right channels of the ridge;

an upper electrode layer disposed on the entire surface of the resultant structure to enclose the ridge and the dielectric layer; and a lower electrode layer disposed on a bottom surface of the substrate, wherein the upper and lower cladding layers have a faster oxidation rate than that of the optical waveguide layer and active layer so that the formation of the oxide layer substantially changes the effective width of the ridge without substantially changing the predetermined width of the active layer or the optical waveguide layer.

2. The semiconductor laser diode according to claim 1, further comprising an additional optical waveguide layer interposed between the active layer and the upper cladding layer.

3. The semiconductor laser diode according to claim 1, wherein the upper and lower cladding layers are a p-type InAlAs layer and an n-type InAlAs layer, respectively, which are lattice-matched to the substrate.

4. The semiconductor laser diode according to claim 3, wherein each of the upper and lower cladding layers is formed to a thickness of about 1 to 2 μm.

5. The semiconductor laser diode according to claim 1, wherein the optical waveguide layer is an undoped InAlGaAs layer having a separate confinement heterostructure (SCH) structure, which is lattice-matched to the substrate.

6. The semiconductor laser diode according to claim 5, wherein the optical waveguide layer is formed to a thickness of about 130 to 170 nm.

7. The semiconductor laser diode according to claim 1, wherein the active layer is obtained by repetitively forming InAs quantum dots, which are spontaneously formed from InAs that is lattice-mismatched to the substrate, and an undoped InAlGaAs barrier layer, which is lattice-matched to the substrate, in several cycles.

8. The semiconductor laser diode according to claim 1, wherein the ohmic contact layer is a p-type InGaAs layer[, which is lattice-matched to the substrate].

9. The semiconductor laser diode according to claim 8, wherein the ohmic contact layer is formed to a thickness of about 130 to 170 nm.

*10. A semiconductor laser diode comprising:*

*a lower cladding layer comprising InAlAs disposed on a substrate;*

*a ridge including an optical waveguide layer, a quantum dot active layer, an upper cladding layer comprising InAlAs, and an ohmic contact layer, which are sequentially stacked on the lower cladding layer, and having a predetermined width, which is obtained by performing a channel etching process on both sides of the ridge, wherein the ridge also includes a portion of the lower cladding layer;*

*an oxide layer formed by oxidizing surfaces of the upper and lower cladding layer to control an effective width of the ridge;*

*a dielectric layer disposed on left and right channels of the ridge;*

*an upper electrode layer disposed on the entire surface of the resultant structure to enclose the ridge and the dielectric layer; and*

*a lower electrode layer,*

*wherein the upper and lower cladding layers have a faster oxidation rate than that of the optical waveguide layer and active layer so that the formation of the oxide layer substantially changes the effective width of the ridge without substantially changing the predetermined width of the active layer or the optical waveguide layer.*

*11. A semiconductor laser diode comprising:*

*a lower cladding layer disposed on a substrate;*

*a ridge having a predetermined width, wherein the ridge comprises:*

*an optical waveguide layer, an active layer, and an upper cladding layer, which are stacked on the lower cladding layer, and*

*a portion of the lower cladding layer; and*

*an oxide layer formed by oxidizing surfaces of the upper and lower cladding layers,*

*wherein the upper and lower cladding layers have a faster oxidation rate than that of the optical waveguide layer and the active layer so that the formation of the oxide layer substantially changes an effective width of the ridge without substantially changing the predetermined width of the active layer or the optical waveguide layer.*

*12. The semiconductor laser diode according to claim 11, wherein the lower and upper cladding layers comprise InAlAs.*

*13. The semiconductor laser diode according to claim 11, wherein the active layer is a quantum dot active layer.*

*14. The semiconductor laser diode according to claim 11, wherein the ridge is obtained by performing a channel etching process on both sides of the ridge.*

*15. The semiconductor laser diode according to claim 11, further comprising:*

*a dielectric layer disposed on at least one side of the ridge;*

*an upper electrode layer disposed on a surface of the dielectric layer, wherein the upper electrode layer encloses the ridge; and*

*a lower electrode layer disposed on a bottom surface of the substrate.*

*16. The semiconductor laser diode according to claim 11, further comprising an additional optical waveguide layer interposed between the active layer and the upper cladding layer.*

*17. The semiconductor laser diode according to claim 11, wherein the upper and lower cladding layers are a p-type InAlAs layer and an n-type InAlAs layer, respectively, which are lattice-matched to the substrate.*

*18. The semiconductor laser diode according to claim 11, wherein each of the upper and lower cladding layers is formed to a thickness of about 1 to 2 μm.*

*19. The semiconductor laser diode according to claim 11, wherein the optical waveguide layer is undoped InAlGaAs layer having a separate confinement heterostructure (SCH) structure, which is lattice-matched to the substrate.*

*20. The semiconductor laser diode according to claim 11, wherein the optical waveguide layer is formed to a thickness of about 130 to 170 nm.*

*21. The semiconductor laser diode according to claim 11, wherein the active layer is obtained by repetitively forming InAs quantum dots, which are spontaneously formed from InAs that is lattice-mismatched to the substrate, and an undoped InAlGaAs barrier layer, which is lattice-matched to the substrate, in several cycles.*

*22. The semiconductor laser diode according to claim 11, further comprising a contact layer, wherein the contact layer is a p-type InGaAs layer, which is lattice-matched to the substrate.*

*23. The semiconductor laser diode according to claim 22, wherein the contact layer is formed to a thickness of about 130 to 170 nm.*

*24. The semiconductor laser diode according to claim 11, wherein the oxide layer is configured to control the effective width of the ridge.*

*25. A semiconductor laser diode comprising:*

*a lower cladding layer disposed on a substrate;*

*a ridge having a predetermined width, wherein the ridge comprises:*

*an optical waveguide layer, an active layer, and an upper cladding layer, which are stacked on the lower cladding layer, and*

*a portion of the lower cladding layer;*

*a first oxide layer formed at one side of the upper cladding layer; and*

*a second oxide layer formed at one side of the lower cladding layer,*

*wherein the upper and lower cladding layers have a faster oxidation rate than that of the optical waveguide layer and the active layer.*

*26. The semiconductor laser diode according to claim 25, wherein the first and the second oxide layers are formed by oxidizing surfaces of the upper and lower cladding layers, respectively.*

*27. The semiconductor laser diode according to claim 26, wherein the first and the second oxide layers substantially change an effective width of the ridge without substantially changing the predetermined width of the active layer or the optical waveguide layer.*

*28. The semiconductor laser diode according to claim 25, wherein the lower and upper cladding layers comprise InAlAs.*

*29. The semiconductor laser diode according to claim 25, wherein the active layer is a quantum dot active layer.*

*30. The semiconductor laser diode according to claim 25, further comprising:*

*a dielectric layer disposed on at least one side of the ridge;*

*an upper electrode layer disposed on a surface of the dielectric layer, wherein the upper electrode layer encloses the ridge; and*

*a lower electrode layer disposed on a bottom surface of the substrate.*

*31. A semiconductor laser diode comprising:*

*a lower cladding layer disposed on a substrate; and*

*a ridge comprising a portion of the lower cladding layer, an optical waveguide layer, an active layer, and an upper cladding layer, wherein:*

*the upper cladding layer comprises an oxidated portion and a non-oxidated portion,*

*a width of the non-oxidated portion of the upper cladding layer is smaller than a width of the optical waveguide layer and a width of the active layer, and*

*the upper and lower cladding layers have a faster oxidation rate than that of the optical waveguide layer and active layer.*

*32. The semiconductor laser diode according to claim 31, wherein the oxidated portion is formed by oxidizing a surface of the upper cladding layer.*

*33. The semiconductor laser diode according to claim 31, wherein the oxidated portion substantially changes an effective width of the ridge without substantially changing a width of the active layer or the optical waveguide layer.*

*34. The semiconductor laser diode according to claim 31, wherein the lower and upper cladding layers comprise InAlAs.*

*35. The semiconductor laser diode according to claim 31, wherein the active layer is a quantum dot active layer.*

*36. The semiconductor laser diode according to claim 31, further comprising:*

*a dielectric layer disposed on at least one side of the ridge;*

*an upper electrode layer disposed on a surface of the dielectric layer, wherein the upper electrode layer encloses the ridge; and*

*a lower electrode layer disposed on a bottom surface of the substrate.*

* * * * *